United States Patent [19]

Pampalone et al.

[11] Patent Number: 4,612,270

[45] Date of Patent: Sep. 16, 1986

[54] TWO-LAYER NEGATIVE RESIST

[75] Inventors: Thomas R. Pampalone, Mendham Township, Morris County; Paula M. Holder, Franklin Park, both of N.J.

[73] Assignee: RCA Corporation, Princeton, N.J.

[21] Appl. No.: 711,720

[22] Filed: Mar. 14, 1985

[51] Int. Cl.$^4$ .................................................. G03C 5/00
[52] U.S. Cl. ................................... 430/273; 430/296; 430/311; 430/312; 430/325; 430/331
[58] Field of Search ............... 430/312, 325, 273, 296, 430/327, 281, 287, 331, 311

[56] References Cited

U.S. PATENT DOCUMENTS

| | | | |
|---|---|---|---|
| 4,169,732 | 10/1979 | Shipley | 430/311 X |
| 4,195,108 | 3/1980 | Gazard et al. | 428/195 |
| 4,203,770 | 5/1980 | Grossa et al. | 430/270 |
| 4,386,152 | 5/1983 | Lai | 430/269 |
| 4,426,247 | 1/1984 | Tamamura et al. | 156/643 |
| 4,438,190 | 3/1984 | Ishimaru et al. | 430/281 |
| 4,550,073 | 10/1985 | Neiss et al. | 430/273 |

FOREIGN PATENT DOCUMENTS 0025088  3/1981  European Pat. Off. ............ 430/312

OTHER PUBLICATIONS

Watts, Solid State Technology, Feb. 1984, pp. 111-113.
Takahashi, Semiconductor International, Dec., 1984, pp. 91-97.
Thompson et al., J. Electrochemical Science and Technology, vol. 126, No. 10, pp. 1703-1708, 1979.

*Primary Examiner*—John E. Kittle
*Assistant Examiner*—José G. Dees
*Attorney, Agent, or Firm*—B. E. Morris; R. Hain Swope

[57] ABSTRACT

The erosion rate of a layer of negative-working resist is markedly reduced by forming thereon a thin layer of polyfunctional acrylate or methylacrylate monomer. Upon irradiation, the monomer insolubilizes at a faster rate than the resist thereby forming a crust thereon. The result is reduced erosion, improved edge acuity and fewer pinholes in the developed resist pattern.

19 Claims, No Drawings

TWO-LAYER NEGATIVE RESIST

This invention relates to media for the lithographic recording of information, particularly utilizing electron beam and X-rays, for use in the manufacture of electronic devices including microelectronic circuits.

BACKGROUND OF THE INVENTION

Significant advances in recent years in the reduction in physical size and cost of electronic circuits have resulted from improvements in manufacturing techniques such as microlithography. In general, microlithography comprises applying a film of radiation sensitive material, i.e. a resist medium, to the surface of a substrate, irradiating a selected portion of the resist layer with a source of irradiation, e.g., ultraviolet light, an electron beam, a laser beam, X-rays or the like, and developing the film with a solvent to remove a portion thereof thus forming a relief pattern. For a positive resist medium, the portion irradiated will be dissolved in the developer solvent whereas the nonirradiated portion will be dissolved for a negative resist medium. The resist material remaining on the surface is utilized as a protective mask to facilitate the selective etching or other treatment of the exposed portion of the underlying substrate.

In general, the good sensitivity possessed by negative resists is more than offset by the loss of both resolution and adhesion to the substrate resulting from development with organic solvents. In addition, a high erosion rate, often exceeding fifty percent, is common with wet development of negative electron beam and X-ray resists. Also, the development of such resists commonly leaves a residual scum on the exposed portion of the substrates which must be removed, conventionally, in an oxygen plasma. The high erosion plus the descumming step often leave only very thin layers of resist so that pinhole defects become a substantial problem.

In accordance with this invention, there are provided negative resist structures which are particularly useful with irradiation means, such as electron beam and X-rays, which, when utilized with conventional negative resists, are characterized by substantial erosion during development. The subject two-layer resist system is ideally suited for direct write irradiation, particularly by electron beam.

SUMMARY OF THE INVENTION

A layer of negative working resist material is coated with a composition comprising a polyfunctional acrylate or methacrylate monomer and a nonsolvent for the resist layer. The monomer insolubilizes upon irradiation to form a protective top layer which significantly reduces the erosion of the resist layer upon development.

DETAILED DESCRIPTION OF THE INVENTION

The first layer of the two-layer resist structure of this invention is a negative working resist material. Suitable materials include conventional resists such as homopolymers or copolymers of glycidyl methacrylate, homopolymers or copolymers of a halogenated styrene or chloromethylated styrene, a composition comprising a novolac resin and a bisazide sensitizer, certain polysiloxanes and the like. A widely used commercial negative resist preparation is a copolymer of glycidyl methacrylate and ethyl acrylate available from Mead Chemical Company under the tradename COP.

A preferred negative resist material for the first layer of the subject structures comprises a phenolic resin and a polyfunctional acrylate or methacrylate monomer as disclosed by Pampalone et al., in a copending U.S. patent application entitled "Resist Media", Ser. No. 672,317, filed Nov. 16, 1984, the disclosure of which is incorporated herein by reference. The phenolic resin portion of the compositions comprises an ortho-, para- or meta-cresol novolac resin, poly(hydroxystyrene) and mixtures thereof. The polyfunctional acrylate or methacrylate monomers are the same as will be described hereinafter with reference to the subject structures. The polyfunctional acrylate or methacrylate monomers are present in the Pampalone et al. resist compositions in from about 5 to about 30, preferably from about 10 to about 15, percent by weight, based on the weight of the phenolic resin present.

The thickness of the first negative resist layer in accordance with this invention is generally between about 0.3 and about 2, preferably between about 0.5 and about 1, micrometers. In the event the substrate to be patterned has topographical features, the thickness of the first resist layer is generally between about 2 and 4 times the height of the tallest topographical feature on the substrate. The thicknesses given above are generally applicable to electron beam or X-ray irradiation of the substrate. When the subject resist structure is to be irradiated with UV or deep UV light, the initial layer of negative resist is substantially thicker, e.g. from about 1 to about 25 micrometers in thickness. Although the subject resist structures are advantageous with all conventional types of irradiation, they are particularly suited for direct write lithography using irradiation which is associated with a substantial degree of erosion of the resist layer during development, such as electron beam.

In accordance with this invention, the first negative resist layer is applied to the substrate, suitably by spin-coating, alowed to air-dry, if desired, and then baked at a temperature between about 70° and 200° C., preferably between about 90° and 150° C., for from about one to thirty minutes, depending on the composition, its thickness and, to a lesser degree, the type of heating means utilized, as is conventional.

The first negative resist layer is then coated with a layer of a composition comprising a solution of a polyfunctional acrylate or methacrylate monomer in a suitable solvent. These monomers contain more than one "acrylate moiety", i.e. the chemical group represented by the formula

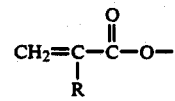

wherein R is hydrogen or methyl. Representative examples of this art-recognized group of monomers include trimethylolpropane triacrylate, trimethylolpropane trimethacrylate, hexamethylenediol diacrylate and pentaerythritol triacrylate.

In order to be acceptable for use in the subject resist structures, the monomer must dissolve in or be readily dispersible in a solvent which is a nonsolvent for the first resist layer. Suitable solvents include cyclohexane, methylcyclohexane and mixtures thereof with minor amounts, e.g. up to about 10 percent by weight, of other solvents such as acetone, methanol and the like. In addition, the monomer must not volatilize or change properties under the high vacuum conditions of electron beam irradiation. Further, the monomer must remain essentially intact as the upper layer of the structure through the various processing steps and temperatures it must endure. Finally, it is important that the monomer insolubilize more readily than the first resist layer upon irradiation.

The monomer is dissolved in the solvent to a concentration of from about 0.5 to 5, preferably from about 1 to 2, percent by weight and spin-coated onto the layer of resist. The coating is allowed to air dry. The monomer coatings in accordance with this invention are thin, i.e. from about 250 to 1100, preferably from about 500 to 600, angstroms. Because the layer of monomer is thin, the inherent low contrast of these monomers does not cause a significant loss of resolution.

The structure comprising a layer of negative resist and a coating of monomer is pattern irradiated with a suitable source of irradation, e.g. ultraviolet light, electron beam, laser beam, X-rays or the like. The irradiation causes the monomer to crosslink over the resist to form an insoluble crust which is relatively impervious to erosion. This crust, however, does not interfere with the irradiation of the underlying resist. The structure is then developed with a conventional developer for the resist. Conventionally, such developers are organic solvents with the exception of the phenolic resin/polyfunctional acrylate or methacrylate compositions of Pampalone et al. which are developable in an aqueous, alkaline composition.

After the resist structure has been developed, it is frequently necessary to remove a residual scum on the exposed portion of the substrate which is characteristic of conventional negative resists such as those containing glycidyl methacrylate. This descumming step is conventionally carried out by treating the substrate with an oxygen plasma for a time sufficient to clean out the irradiated areas of the substrate surface.

Because the crossliked monomer layer erodes to a markedly lower degree than the underlying resist, the subject structures are advantageous in that the potential for pinhole formation in the patterned resist film is significantly lower than would be expected using only a single layer of conventional negative resist. The subject structures undergo substantially less erosion at a nominal dosage of irradiation than a single layer of conventional negative resist. The nominal irradiation dosage is that which produces a pattern of the same width as the irradiating beam. Those skilled in the art are aware that, in the instance of a negative resist, irradiation dosages above the nominal level will increase the insolubility of the irradiated portion of the film and therefore decrease erosion, but will also increase the width of the pattern, due principally to effects such as backscattering from the substrate surface. Therefore, the fact that the subject structures undergo substantially less erosion at nominal dosage is a significant advantage.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Four inch square glass plates having a 1 micrometer thick coating of chromium were utilized as substrates. A solution containing 15 percent of poly(hydroxystyrene) and 1.5 percent of trimethylolpropane triacrylate in propyleneglycolmethylether acetate was spin-coated onto the substrate, air-dried and baked for 30 minutes at 90° to yield a coating 0.5 micrometer thick.

Solutions of 1, 1.5 and 2 percent respectively, of trimethylolpropane triacrylate in cyclohexane were spin-coated onto the above substrates and air-dried to yield films 250, 550 and 1100 angstroms thick, respectively.

The coated substrates were irradiated with a MEBES I electron beam generator with dosages of from 5 to 30 micro Coulombs per square centimeter and developed by immersion in Waycoat HPRD 1084 developer, Philip A. Hunt Chemical Corp., diluted 1:5 with deionized water, for 60 seconds. The irradiation pattern contained large solid areas and a series of areas of lines and spaces from one-half to ten micrometers wide.

From normalized film thicknesses remaining after development for each log irradiation dosage, a typical exposure curve was generated. From the slope of the curve, the contrast and sensitivities at 0 percent erosion ($D_0$) and fifty percent erosion ($D_{0.5}$) were calculated. $D_0$ and $D_{0.5}$ are the dosages at which erosion begins and one-half of the film is removed, respectively. Contrast is conventionally defined as the slope of a curve obtained by plotting percent film remaining after development against the log of the irradiation dose. The resolution for a given dosage was determined by the pattern in which lines and spaces were cleanly delineated. A substrate coated with the resist but not with the monomer served as a control. The results are reported in Table I.

TABLE I

| Monomer Thickness (Angstroms) | Contrast | $D_0$ (MicroC/cm$^2$) | $D_{0.5}$ | Pattern Resolution (Micrometers) |
|---|---|---|---|---|
| 0 (control) | 0.7 | ~110 | 30 | 0.5 |
| 250 | 1.6 | 44 | 13 | 0.5 |
| 550 | 2.0 | 31 | 17 | 1 |
| 1100 | 2.0 | 15 | 8 | 2 |

It is evident that a 250 angstrom thick coating of the monomer increases sensitivity ($D_{0.5}$) from 30 to 13 microC/cm$^2$ at the same level of resolution. Increasing the thickness of the monomer coating increases the sensitivity at the expense of some loss of resolution.

EXAMPLE 2

Substrates double-coated, irradiated and developed in accordance with Example 1 were etched in an oxygen plasma for two minutes to remove the acrylate top layer. It was observed that the acrylate layer could be removed with little or no loss of the underlying resist layer since the etch rate of the acrylate layer was approximately three times that of the resist layer. In this manner the resolution could be increased in certain instances. For example, the substrate having a 550 angstrom thick coating of acrylate was unable to attain resolution of 0.5 micrometer lines and spaces. After removal of the acrylate layer in an oxygen plasma, the underlying patterned resist layer attained 0.5 micrometer resolution. These results demonstrate that the subject monomer coating can be utilized to increase sensitivity and reduce erosion of a negative resist layer and then be removed to take advantage of the high resolution of the underlying resist layer.

EXAMPLE 3

The lateral distribution of the monomer layer of the subject invention was determined by allowing a substrate coated with a first layer of poly(hydroxystyrene) and, thereover, 1100 angstroms of monomer in the manner described in Example 1, to stand over a period of three days. The substrate was then blanket irradiated with sufficient pulsed deep UV light to harden the monomer. An IR spectrum of the structure was taken after which the composition was ion milled by degrees. An IR spectrum, taken after each stage, showed the acrylate to be almost entirely distributed in the upper one-third of the composite.

Scanning electron micrographs of samples of the patterned substrates produced in Example 1 showed in all instances that nearly the full thickness of acrylate crust remained on the top of the composite.

EXAMPLE 4

Substrates coated with a 0.5 micrometer thick coating of resist in the manner described in Example 1 were spin-coated at 4000 rpm with a 1.8 percent solution of pentaerythritol triacrylate in a 90:10 mixture of cyclohexane and acetone. The solvent completely evaporated on the spinner leaving a coating of monomer 600 angstoms thick. The substrates were irradiated with from 15 to 30 microC/cm² of electron beam and developed as in Example 1. Contrast, sensitivity and pattern resolution were determined as in Example 1. The 600 angstrom thick monomer coating demonstrated a contrast of 2.0, $D_0$ and $D_{0.5}$ of 27 and 17 microC/cm², respectively, and a pattern resolution of 1 micrometer.

EXAMPLE 5

Commercially available substrates consisting of four inch glass plates coated with a one micrometer thick layer of chromium over which was deposited 0.6 micrometer of COP, i.e. a copolymer of glycidylmethacrylate and ethylacrylate, were coated with a 550 angstrom thick layer of trimethylolpropane triacrylate in the manner described in Example 1. The plates were irradiated with an electron beam as in Example 1 using dosages of from 0.125 to 0.75 microC/cm².

The plates were developed in automated development equipment commercially available for developing COP resist. The plates were descummed in an oxygen plasma as conventionally recommended for COP resist. In both instances, the time recommended was doubled to assure good clean out, and to remove the remaining acrylate overcoat, respectively. The resist thickness remaining after development and after descum was measured in each instance using a profilometer. The results are reported in Table II.

TABLE II

| Dosage microC/cm² | Thickness in Micrometer | |
|---|---|---|
| | After Development (Percent) | After Descum (Percent) |
| COP: Thickness 0.602 Micrometer | | |
| 0.125 | <0.1 | none |
| 0.250 | 0.182 (30.2) | 0.168 (27.9) |
| 0.500 | 0.329 (54.6) | 0.302 (50.1) |
| 0.625 | 0.389 (64.6) | 0.320 (53.1) |
| 0.750 | 0.397 (65.9) | 0.349 (58.0) |

TABLE II-continued

| Dosage microC/cm² | Thickness in Micrometer | |
|---|---|---|
| | After Development (Percent) | After Descum (Percent) |
| COP and Monomer: Thickness 0.657 Micrometer. | | |
| 0.125 | <0.1 | none |
| 0.250 | 0.406 (61.8) | 0.355 (54.0) |
| 0.375 | 0.440 (67.0) | 0.365 (55.6) |
| 0.500 | 0.510 (77.6) | 0.415 (63.2) |
| 0.750 | 0.540 (82.2) | 0.430 (65.4) |
| 1.000 | 0.545 (83.0) | 0.440 (67.0) |

These results indicate that irradiation of COP resist film with a dosage in the nominal range, i.e. about 0.25 microC/cm², is possible in accordance with the present method with a final retention of over fifty percent of the original film thickness. It is evident from the data in Table II that a significantly higher percent of a COP film is retained with the monomer coating when irradiated with a dosage in the conventional range.

Comparing the films at the important nominal dosage of 0.250 microC/cm², the thickness of the monomer coated film remaining after descum was almost twice that of the uncoated COP film which retained only about 28 percent. The substantial erosion of the COP film significantly increases the potential for pinholes in the remaining film.

In all instances using the double coating, good resolution was obtained on a pattern of two micrometer wide lines and spaces. Edge definition was excellent.

We claim:

1. A medium for lithographic recording comprising a substrate having on a surface thereof a first layer comprising a negative-working resist and a second layer consisting essentially of a polyfunctional acrylate or methacrylate monomer.

2. A medium in accordance with claim 1, wherein the polyfunctional monomer is selected from the group consisting of trimethylolpropane triacrylate, trimethylolpropane trimethacrylate, hexamethylenediol diacrylate and pentaerythritol triacrylate.

3. A medium in accordance with claim 2, wherein the monomer is trimethylolpropane triacrylate.

4. A medium in accordance with claim 2, wherein the monomer is pentaerythritol triacrylate.

5. A medium in accordance with claim 1, wherein the negative-working resist is a homopolymer or copolymer of glycidyl methacrylate.

6. A medium in accordance with claim 5, wherein the negative-working resist is a copolymer of glycidyl methacrylate and ethyl acrylate.

7. A medium in accordance with claim 1, wherein the negative-working resist is a homopolymer or copolymer of a halogenated styrene or chloromethylated styrene.

8. A medium in accordance with claim 1, wherein the negative-working resist comprises a phenolic resin selected from the group consisting of an ortho-cresol novolac resin, a meta-cresol novolac resin, a para-cresol novolac resin, poly(hydroxystyrene) and mixtures thereof and a polyfunctional acrylate or methacrylate monomer.

9. A medium in accordance with claim 1, wherein the negative-working resist comprises poly(hydroxystyrene) and trimethylolpropane triacrylate and the monomer is trimethylolpropane triacrylate.

10. A medium in accordance with claim 1, wherein the negative-working resist is a copolymer of glycidyl methacrylate and ethyl acrylate and the monomer is trimethylolpropane triacrylate.

11. A process of forming a relief pattern on a substrate consisting essentially of:
(a) forming a layer of a negative-working resist on the substrate;
(b) coating the resist layer with a composition consisting essentially of a solution of a polyfunctional acrylate or methacrylate monomer in a suitable solvent which is a nonsolvent for the resist layer;
(c) drying the coating to form a film;
(d) irradiating a selected portion of the resulting two-layer structure with a source of irradiation; and
(e) developing the structure to remove that portion not irradiated, thus exposing a corresponding portion of the substrate.

12. A process in accordance with claim 11, wherein the solvent for said monomer comprises cyclohexane or methylcyclohexane.

13. A process in accordance with claim 11, wherein the source of irradiation is an electron beam.

14. A process in accordance with claim 11, wherein the polyfunctional monomer is selected from the group consisting of trimethylolpropane triacrylate, trimethylolpropane trimethacrylate, hexamethylenediol diacrylate, and pentaerythritol triacrylate.

15. A process in accordance with claim 14, wherein the monomer is trimethylolpropane triacrylate.

16. A process in accordance with claim 14, wherein the monomer is pentaerythritol triacrylate.

17. A process in accordance with claim 11, wherein the negative-working resist is a homopolymer or copolymer of glycidyl methacrylate.

18. A process in a accordance with claim 11 additionally including the step of removing residual scum from the exposed portion of the substrate.

19. A process in accordance with claim 18, wherein the scum is removed by treating the substrate with an oxygen plasma.

* * * * *